(12) United States Patent
White et al.

(10) Patent No.: US 6,868,899 B1
(45) Date of Patent: Mar. 22, 2005

(54) VARIABLE HEIGHT THERMAL INTERFACE

(75) Inventors: Joseph M. White, Windsor, CO (US); Andrew D. Delano, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 9 days.

(21) Appl. No.: 10/649,519

(22) Filed: Aug. 25, 2003

(51) Int. Cl.[7] .................................................. F28F 7/00
(52) U.S. Cl. ........................ 165/185; 361/710; 361/704; 257/707; 174/16.3
(58) Field of Search ............................... 165/185, 80.3; 361/704, 710; 174/16.3; 257/707

(56) References Cited

U.S. PATENT DOCUMENTS

| | | | | |
|---|---|---|---|---|
| 5,042,257 | A | * 8/1991 | Kendrick et al. | 62/3.1 |
| 5,083,373 | A | * 1/1992 | Hamburgen | 29/890.03 |
| 5,456,081 | A | * 10/1995 | Chrysler et al. | 62/3.7 |
| 5,514,327 | A | * 5/1996 | Schneider | 419/36 |
| 5,660,917 | A | * 8/1997 | Fujimori et al. | 428/195.1 |
| 5,787,976 | A | * 8/1998 | Hamburgen et al. | 165/185 |
| 6,046,498 | A | * 4/2000 | Yoshikawa | 257/706 |
| 6,538,892 | B2 | * 3/2003 | Smalc | 361/710 |
| 6,625,026 | B1 | * 9/2003 | Boudreaux et al. | 361/705 |
| 6,671,957 | B2 | * 1/2004 | Diels | 29/890.03 |
| 6,702,007 | B1 | * 3/2004 | Pan et al. | 165/185 |

OTHER PUBLICATIONS

White, Joseph M., et al., "Method of Assembly of a Wedge Thermal Interface to Allow Expansion After Assembly," Attorney Docket No. 200300041–1, filed Aug. 25, 2003, concurrently herewith.

Rubenstein, Brandon A., Heat Sink Hold–Down with Fan–Module Attach Location,: S/N 10/419,386, filed Apr. 21, 2003.

Delano, Andrew D., et al., "Variable–Gap Thermal–Interface Device," S/N 10/419,373, filed Apr. 21, 2003.

Delano, Andrew D., et al., "Variable–Wedge Thermal–Interface Device," S/N 10/419,406, filed Apr. 21, 2003.

Belady, Christian L., et al., Thermal Transfer Interface System and Methods, S/N 10/074,642, filed Feb. 12, 2002.

* cited by examiner

Primary Examiner—Terrell McKinnon

(57) ABSTRACT

A variable-height thermal-interface device is provided for transferring heat from a heat source to a sink. The device comprises a first uniaxial rotary cylindrical joint comprising a first cylindrically concave surface in slidable contact with a first cylindrically convex surface. The first cylindrically concave surface and the first cylindrically convex surface share a common first radius of curvature relative to a common first cylinder axis. The first cylindrically concave surface is operable to rotate about the common first cylinder axis relative to the first cylindrically concave surface to compensate for uniaxial angular misalignment between the source and the heat sink.

18 Claims, 3 Drawing Sheets

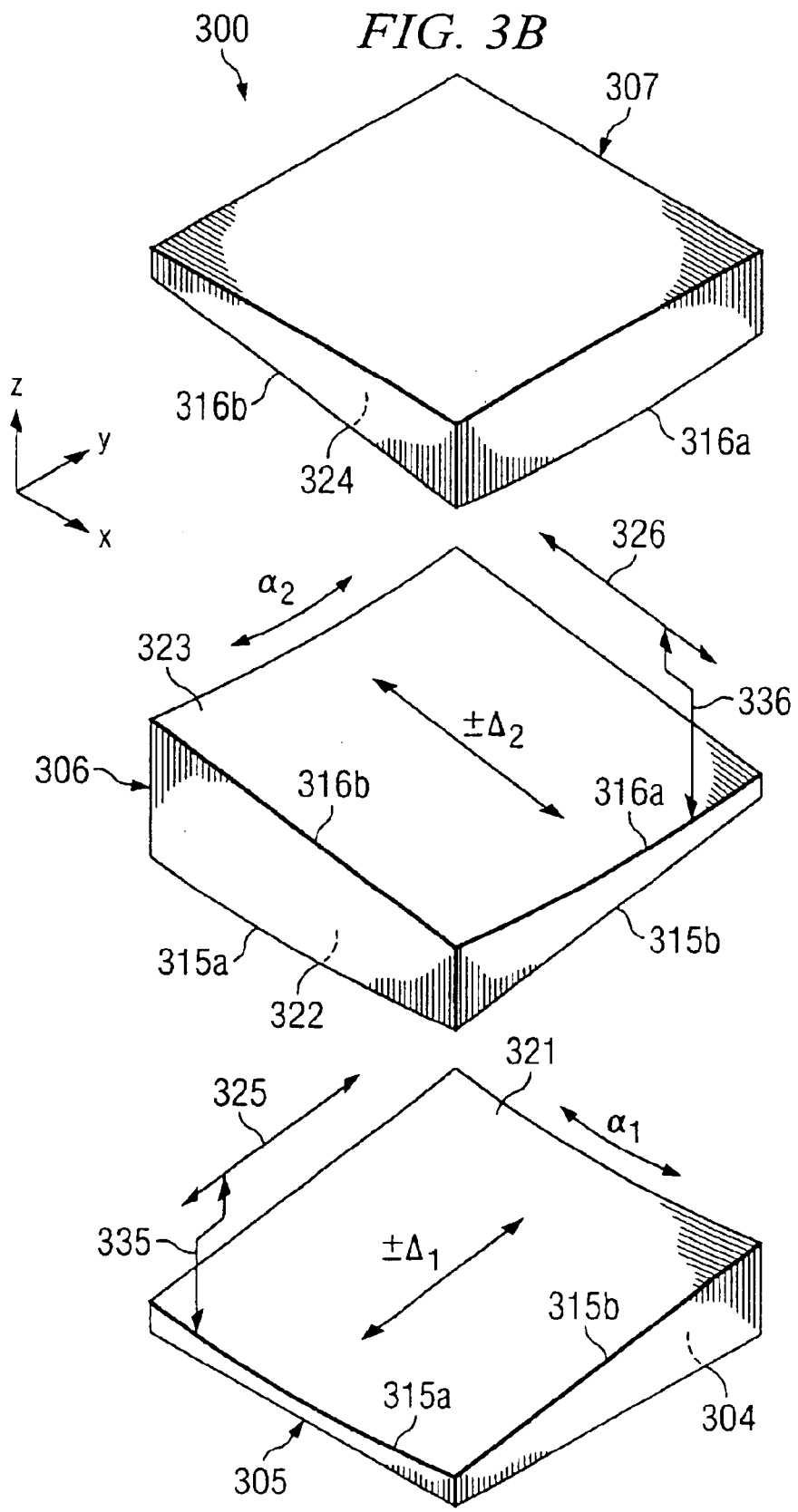

VARIABLE HEIGHT THERMAL INTERFACE

CROSS-REFERENCE TO RELATED APPLICATIONS

This application is related to concurrently filed, co-pending, and commonly assigned U.S. patent application Ser. No. 10/649,518, filed Aug. 25, 2003, titled "METHOD OF ASSEMBLY OF A WEDGE THERMAL INTERFACE TO ALLOW EXPANSION AFTER ASSEMBLY"; co-pending and commonly assigned U.S. patent application Ser. No. 10/419,386, titled "HEAT SINK HOLD-DOWN WITH FAN-MODULE ATTACH LOCATION," filed Apr. 21, 2003; co-pending and commonly assigned U.S. patent application Ser. No. 10/419,373, titled "VARIABLE-GAP THERMAL-INTERFACE DEVICE," filed Apr. 21, 2003; co-pending and commonly assigned U.S. patent application Ser. No. 10/419,406, titled "VARIABLE-WEDGE THERMAL-INTERFACE DEVICE," filed Apr. 21,2003; and co-pending and commonly assigned U.S. patent application Ser. No. 10/074,642, titled THERMAL TRANSFER INTERFACE SYSTEM AND METHODS," filed Feb. 12, 2002; the disclosures of all of which are hereby incorporated herein by reference.

FIELD OF THE INVENTION

This invention relates to heat transfer and more particularly to a variable height thermal interface.

DESCRIPTION OF THE RELATED ART

There are circumstances in which a heat sink is fixed at a set distance above a heat source, for example a processor or other active electronic device. Due to variations in thickness of the parts, primarily the active device, a gap of unknown height may exist between the heat sink and the active device. There is then a need for a thermal interface to fill the gap and concurrently provide good heat transfer properties.

Traditionally, heat has been transferred between a heat source and a heat sink across non-uniform width gaps through the use of "gap pads," or silicone-based elastic pads. For example, The Bergquist Company (see web page http://www.bergquistcompany.com/tm_gap_list.cfm and related web pages) offers a range of conformable, low-modulus filled silicone elastomer pads of various thickness on rubber-coated fiberglass carrier films. This material can be used as a thermal-interface, where one side of the interface is in contact with an active electronic device. Relative to metals, these pads have low thermal conductivity. Furthermore, large forces are generally required to compress these pads. Moreover, silicone-based gap pads cannot withstand high temperatures.

BRIEF SUMMARY OF THE INVENTION

In accordance with an embodiment disclosed herein, a variable-height thermal-interface device is provided for transferring heat from a heat source to a heat sink. The device comprises a first uniaxial rotary cylindrical joint comprising a first cylindrically concave surface in slidable contact with a first cylindrically convex surface. The first cylindrically concave surface and the first cylindrically convex surface share a common first radius of curvature relative to a common first cylinder axis. The first cylindrically concave surface is operable to rotate about the common first cylinder axis relative to the fist cylindrically convex surface to compensate for uniaxial angular misalignment between the heat source and the heat sink.

In accordance with another embodiment disclosed herein, a variable-height thermal-interface device is provided for transferring heat from a heat source to a heat sink. The device comprises a first wedge interface having a first planar surface in slidable contact with a second planar surface. The slidably contacting first and second planar surfaces are inclined diagonally relative to the z-axis parallel to the shortest distance between the heat source and the heat sink. The first wedge interface is operable to provide z-axis expansion of the variable height thermal interface device. The device further comprises a second wedge interface having a third planar surface in slidable contact with a fourth planar surface. The slidably contacting third and fourth planar surfaces are inclined diagonally relative to the z-axis. The second wedge interface is operable to provide z-axis expansion of the variable height thermal interface device.

In accordance with yet another embodiment disclosed herein, a method of transferring heat from a heat source to a heat sink using a variable-height thermal-interface device is provided. The method comprises providing a first uniaxial rotary cylindrical joint comprising a first cylindrically concave surface in slidable contact with a first cylindrically convex surface, the first cylindrically convex surface and the first cylindrically concave surface sharing a common first radius of curvature relative to a common first cylinder axis. The method further comprises sliding the first cylindrically concave surface relative to the first cylindrically convex surface, causing filling of gaps between the heat source and the heat sink. The method further comprises applying compressive loading between the heat source and the heat sink through the first uniaxial rotary cylindrical joint, and transferring heat from the heat source through the first uniaxial rotary cylindrical joint to the heat sink.

BRIEF DESCRIPTION OF THE DRAWINGS

FIG. 3B is an exploded perspective view of an embodiment illustrating the variable-height thermal-interface device of FIG. 3A.

DETAILED DESCRIPTION

The embodiments disclosed herein describe a system and method for creating a thermal interface that will fill a variable gap and concurrently provide efficient heat transfer properties.

Figure 1A:
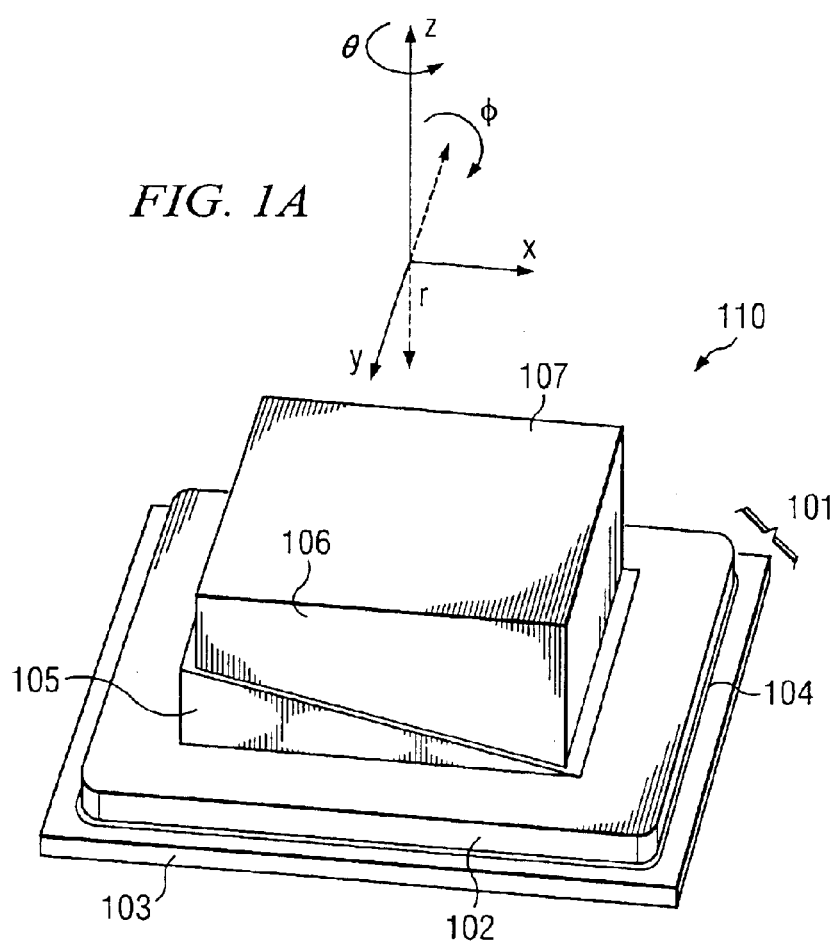
FIG. 1A is a perspective view of an embodiment illustrating a variable-wedge thermal-interface device
Figure 1B:
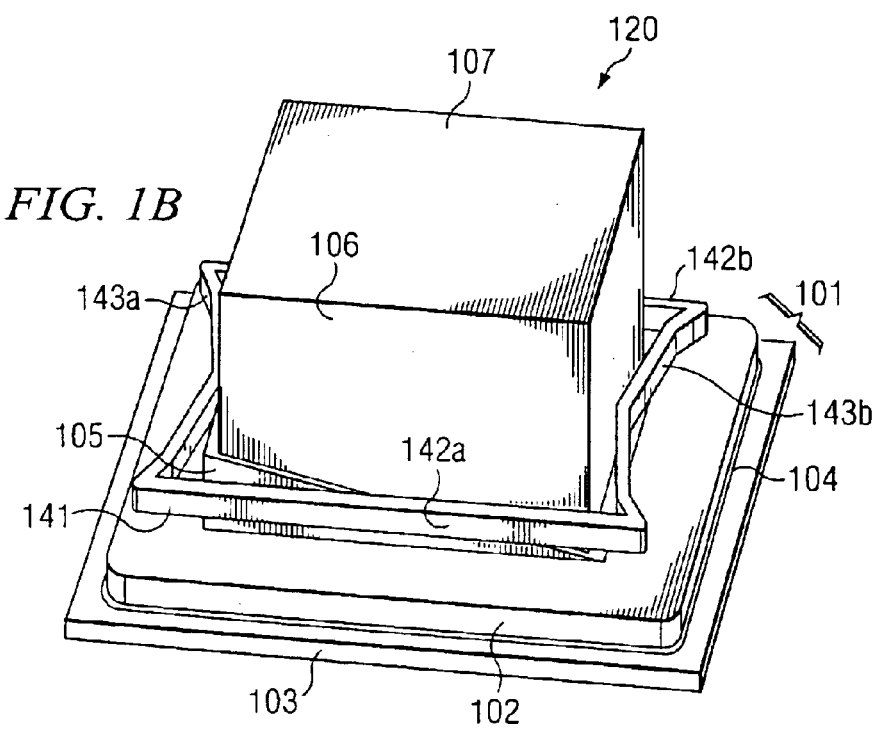
FIG. 1B is a perspective view of an embodiment illustrating a spring-loaded variable-wedge thermal-interface device, in which a spring clip is added to the thermal-interface device of FIG. 1A.

FIGS. 1A and 1B show a wedge-based variable gap thermal interface, as disclosed in co-pending and commonly assigned U.S. patent application Ser. No. 10/419,406, the disclosure of which has been incorporated herein by reference.

FIG. 1A is a perspective view of an embodiment illustrating variable-wedge thermal-interface device 110. Thermal-interface device 110 comprises heat sink extension 106 with flat upper end 107 mechanically and thermally coupled to a heat sink base (not shown in FIG. 1A). Alternatively, heat sink extension 106 may be fabricated as an integral part of the heat sink or heat sink base. For convenience, coordinate axes are shown in FIG. 1A, such that x, y, and z are orthogonal rectangular axes fixed with respect to heat sink extension 106 and rotating through angular coordinates θ and φ about the respective z and y axes. Heat sink extension 106 has a lower flat face inclined at a wedge angle relative to the x-axis in the example of FIG. 1A.

Lower wedge element 105 has an upper surface inclined at the same wedge angle and making sliding contact with the lower inclined flat face of heat sink extension 106. Although the lower flat face of lower wedge element 105 can be inclined at any angle relative to the xyz rotating coordinate system, for convenience in the example of FIG. 1A it is oriented parallel to the rotating xy plane. Likewise, although the lower flat face of lower wedge element 105 can be inclined at any angle relative to flat upper end 107 of heat sink extension 106, for convenience in the example of FIG. 1A it is oriented parallel to flat upper end 107. Lower wedge element 105 is coupled thermally and mechanically to heat source 101 and thus provides efficient heat transfer from heat source 101 through solid, high thermal-conductivity material of lower wedge element 105 and heat sink extension 106 to the heat sink base. The sliding-contact interface between lower wedge element 105 and heat sink extension 106 may be filled with a conformal thermal-interface material, typically thermal grease or paste, to reduce both thermal resistance and friction. Heat source 101, as shown in the example of FIG. 1A, includes processor chip 104, processor lid 102, and circuit board 103.

FIG. 1B is a perspective view of an embodiment illustrating spring-loaded variable-wedge thermal-interface device 120, in which spring clip 141 is added to thermal-interface device 110 of FIG. 1A. A wedge-based thermal-interface device including a spring clip is disclosed in co-pending and commonly assigned U.S. patent application Ser. No. 10/419,406, the disclosure of which has been incorporated herein by reference. In the example of FIG. 1B, wedge element 105 and heat sink extension 106 are spring-loaded together in the x-direction by spring clip 141. In one variation, spring clip 141 is shaped approximating a deformed rectangular frame. Two opposing sides 142a, 142b may be but need not necessarily be straight and parallel as shown in FIG. 1B. Two alternating opposing sides 143a, 143b are typically bent inward toward one another and are pre-stressed to exert a compressive force toward one another.

In spring-loaded variable-wedge thermal-interface device 120, spring clip 141 is aligned, so that a first inwardly bent side, for example side 143a, presses against the largest area vertical surface (aligned normal to the x-axis) of wedge element 105, and a second inwardly bent side, for example side 143b, presses against the largest area vertical surface (also aligned normal to the x-axis) of heat sink extension 106. The combined compressive forces applied by spring clip 141 to wedge element 105 and heat sink extension 106 generate shear force components across the inclined interface between wedge element 105 and heat sink extension 106, urging the contacting inclined interface surfaces of wedge element 105 and heat sink extension 106 to slide relative to one another, thereby driving wedge element 105 to expand the z-axis length of spring-loaded variable-wedge thermal-interface device 120 to fill the available gap between heat sink extension 106 and heat source 101. This simultaneously drives wedge element 105 along the x-axis to become offset relative to heat sink extension 106, thereby somewhat reducing the inclined surface contact area. When the z-axis gap is filled, z-axis compressive forces prevent further offset between wedge element 105 and heat sink extension 106. Spring clip 141 may be used similarly to apply shear forces to sliding wedge elements in other applications, including both heat transfer and non-heat transfer applications. Optionally, spring clip 141 may be attached to one of the wedge elements using a screw, bolt, or other traditional fastener.

Figure 2:
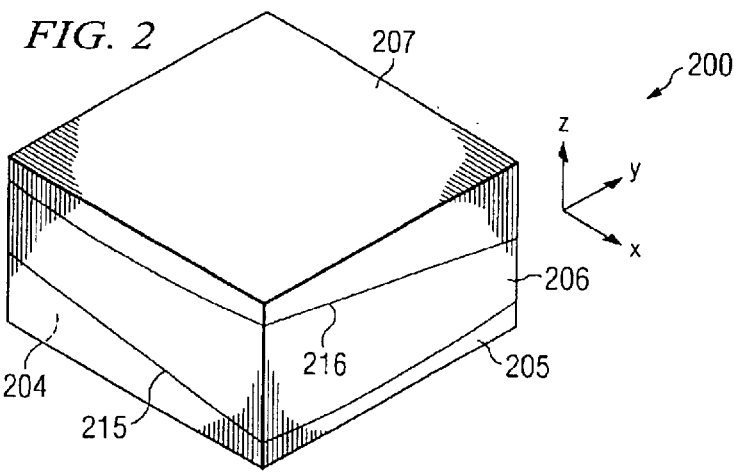
FIG. 2 is a perspective view of an embodiment illustrating a cascaded variable-wedge thermal-interface device, in which two or more wedge structures similar to variable-wedge thermal-interface devices depicted in FIGS. 1A and 1B are stacked or cascaded in the z-direction.

FIG. 2 is a perspective view of an embodiment illustrating cascaded variable-wedge thermal-interface device 200, in which two or more wedge structures similar to variable-wedge thermal-interface devices 110 and 120 depicted in FIGS. 1A and 1B are stacked or cascaded in the z-direction. For purposes of illustration, in the example of FIG. 2 are depicted two such wedge structures having inclined wedge interfaces 215 and 216 oriented at a 90-degree rotation angle about the z-axis relative to one another. In other implementations, arbitrary numbers of wedge structures may be stacked at arbitrary orientations relative to one another. For most applications, however, there is little or no advantage achieved by increasing the number of cascaded wedge structures beyond two.

In the example depicted in FIG. 2, wedge interface 215, formed between lower wedge element 205 and second wedge element 206, is inclined to provide offset motion along the x-direction, whereas wedge interface 216, formed between second wedge element 206 and heat sink extension 207, is inclined to provide offset motion along the y-direction. Lower surface 204 of lower wedge element 205 is typically flat and is coupled thermally and mechanically with a heat source, for example heat source 101 in FIGS. 1A and 1B, whereas heat sink extension 207 typically has a flat upper surface, but is typically coupled thermally and mechanically with a heat sink (not pictured). The upper surface of heat sink extension 207 is typically but not necessarily parallel to lower surface 204. Alternatively, heat sink extension 207 may be fabricated as an integral part of a heat sink or heat sink base. Multiply-cascaded wedge thermal interfaces, for example wedge interfaces 215 and/or 216, may be spring-loaded under shear force, for example using spring clips, as represented by spring clip 141 in FIG. 1B.

Co-pending and commonly assigned U.S. patent application Ser. No. 10/419,406, the disclosure of which has been incorporated herein by reference, discloses a variable-wedge thermal-interface device that includes a multi-axis rotary spherical joint. This implementation is particularly advantageous for multi-axis angular adjustment in a situation in which the heat source and the heat sink may lie in non-parallel planes and/or where the distance between heat source and heat sink is non-uniform. This situation arises frequently when attempting to conduct heat from multiple heat sources to a single heat sink.

Figure 3A:
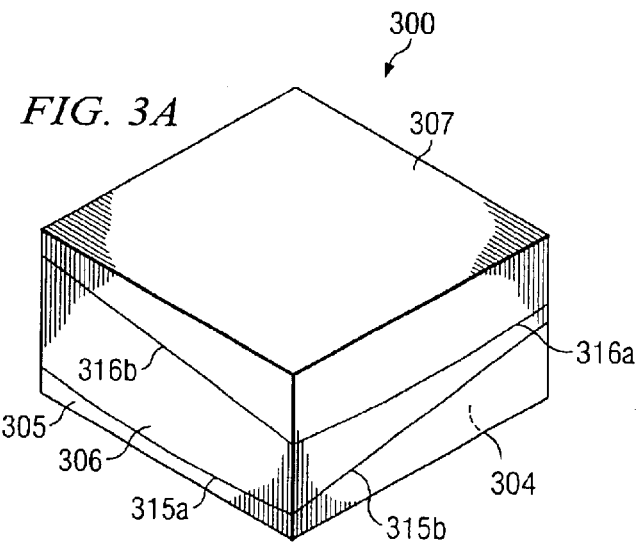
FIG. 3A is a perspective view of an embodiment illustrating an assembled variable-height thermal-interface device, including at least one single-axis rotary cylindrical joint.

FIG. 3A is a perspective view of an embodiment illustrating assembled variable-height thermal-interface device 300, including at least one single-axis rotary cylindrical joint 315a–315b, 316a–316b. FIG. 3B is an exploded perspective view of an embodiment illustrating variable-height thermal-interface device 300. FIGS. 3A–3B depict a variable-height thermal-interface device 300 including two cascaded cylindrical joints 315a–315b and 316a–316b oriented orthogonally relative to one another about the z-axis and having respective cylinder axes 325 and 326 each inclined relative to the x-y plane. In general, variable-height thermal-interface devices, in accordance with the disclosed embodiments, may contain from one cylindrical joint to any number of cascaded cylindrical joints, each of which may be oriented at any angle(s) about the z-axis relative to any other cylindrical joint, and each of which may have a cylinder axis oriented parallel with the x-y plane or inclined at any angle relative to the x-y plane.

In the example embodiment depicted in FIG. 3A and/or 3B, cylindrical joint 315a–315b is formed at the sliding interface between concave upper surface 321 of lower element 305 and convex lower surface 322 (hidden in FIG. 3B) of second element 306. Concave surface 321 and convex surface 322 have radii of curvature matched to one another, represented by broken-line arrow 335, centered at cylinder axis 325. Concave surface 321 is rotatably slidable relative to convex surface 322 about cylinder axis 325, as represented by curved arrows $\alpha_1$, providing single-axis bending capability in variable-height thermal-interface device 300. Orthogonally, concave surface 321 is linearly slidable parallel to cylinder axis 325 relative to convex surface 322, as represented by linear arrows $\pm\Delta_1$, providing single-axis translation capability in variable-height thermal-interface device 300.

Cylindrical joint 316a–316b is similarly formed at the sliding interface between concave upper surface 323 of second element 306 and the convex lower surface 324 (hidden in FIG. 3B) of heat sink extension 307. Concave surface 323 and convex surface 324 have radii of curvature matched to one another, represented by broken-line arrow 336, centered at cylinder axis 326. Concave surface 323 is rotatably slidable relative to convex surface 324 about cylinder axis 326, as represented by curved arrows $\alpha_2$, providing single-axis bending capability in variable-height thermal-interface device 300. Orthogonally, concave surface 323 is linearly slidable, parallel to cylinder axis 326 relative to convex surface 324, as represented by linear arrows $\pm\Delta_2$, providing single-axis translation capability in variable-height thermal-interface device 300.

Radii of curvature 335 and 336 may be but need not necessarily be matched between different joints of the same variable height thermal interface device. Cylinder axes 325, 326 may be parallel to the x-y plane or may be oriented or inclined at any angle relative to the x-y plane and/or relative to one another. Cylindrical joints having cylinder axes so inclined may interface wedged elements, such that relative translation between interfacing elements provides z-axis expansion of the variable height thermal interface device. Interfacing elements of a cylindrical joint may optionally be spring-loaded for shear force across the interface, facilitating z-axis expansion in a manner similar to spring-loaded variable-wedge thermal-interface device 120 depicted in FIG. 1B. As in the case of variable height thermal interface devices previously described herein, the interfaces between contacting cylindrical surfaces may be filled with a thermal-interface material, typically thermal grease or paste, to reduce both thermal resistance and sliding friction.

Two stacked or cascaded orthogonally oriented cylindrical joints provide the same degrees of bending motion as those provided by a single rotary spherical joint. Advantages of a cylindrical-joint variable thermal interface implementation include:

First, a cylindrical surface is much easier to fabricate than a sphere. A cylindrical surface can be machined using many methods, including any of the following methods:

Horizontal form milling;
Crush-form grinding;
Diamond dress grinding (traditional method of grinding bearing raceways);
Fly-cutting, where the path of the part is at an oblique angle to the axis of the fly-cutter. This will in reality create a surface that is not quite cylindrical, but rather elliptical. Modeling has shown that the deviation between the surfaces can be less than 1.5 nanometers (run), when the rotation range required for heat source tilt is considered.

The cost of machining a bearing raceway is $0.05 to $0.10 per cut. If all three elements of a variable height thermal interface device were made of copper, about 32 grams of copper would be required, at a total material cost of about $0.22. The cost of machining each of the six required cuts is ~$0.60. An assembly could then cost less than a dollar.

Second, with two stacked inclined cylindrical joints, the vertical travel can be taken up by both of the effective wedges. This doubles the vertical travel range of the variable height thermal interface. In accordance with the embodiments disclosed herein, a variable height thermal interface device may include from one to any larger number of stacked cylindrical joints, spherical joints, wedge interfaces, or any combination of these three structures. A cylindrical or spherical joint provides respectively uniaxial or multi-axial compensation for misalignment between a heat source and a heat sink, whereas a wedge interface provides variable height z-axis gap compensation between the heat source and heat sink. An inclined-axis cylindrical joint provides hybrid capabilities of a cylindrical joint combined with a wedge interface.

Wedge-based variable thermal-interface devices, for example variable thermal interface devices 200 and 300 are potentially scalable dimensionally over a range from nanometers (mn) to meters.

Figure 4:
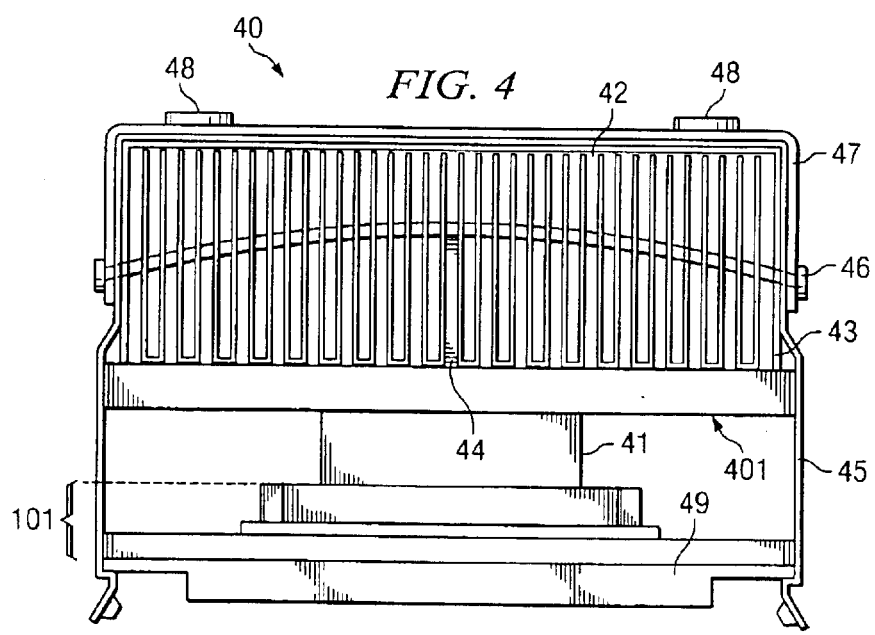
FIG. 4 is a schematic diagram of an embodiment illustrating a heat sink hold-down device, in accordance with a disclosure incorporated herein.

In practice, the compressive load between the heat sink base and bolster plate in any of the embodiments disclosed herein can be provided by any of a variety of heat sink hold-down devices. An advantageous configuration of such a hold-down device is disclosed in co-pending and commonly assigned U.S. patent application Ser. No. 10/419,386, the disclosure of which has been incorporated herein by reference. FIG. 4 is a schematic diagram of an embodiment illustrating heat sink hold-down device 40, in accordance with the above-incorporated disclosure. Bolster plate 49 supports heat source 101. Heat sink 43 includes heat sink base 401 attached to central post 44, and finned structure 42. Cage 45 is attached with clips to bolster plate 49 and supports lever spring 46 through clearance slots. Cap 47 rigidly attached to cage 45 using screws or other fasteners 48 presses downward on the ends of lever spring 46, which transfer the load through a bending moment to central post 44. Central post 44 is disposed to distribute the load symmetrically across the area of heat sink base 401.

In some embodiments, heat sink extension 41 transfers the compressive loading between heat sink base 401 and heat source 101. Alternatively, a variable-height thermal-interface device in accordance with the present embodiments, for example variable-height thermal-interface device 110, 120, 200 or cylindrical joint variable-height thermal-interface device 300, is coupled thermally and mechanically with heat sink hold-down device 40, replacing at least in part heat sink extension 41. In this configuration, heat sink hold-down device 40 applies the loading that holds variable-height thermal-interface device 110, 120, 200 or cylindrical joint variable-height thermal-interface device 300 under compression against heat source 101.

Embodiments disclosed herein address the problem of minimizing the thermal resistance between a heat source and a heat sink for a situation in which the heat source and the heat sink may lie in non-parallel planes and/or where the distance between heat source and heat sink is non-uniform. This is a problem that arises especially when attempting to conduct heat from more than one heat source to a single heat sink.

What is claimed is:

1. A variable-height thermal-interface device for transferring heat from a heat source to a heat sink, said device comprising:
   a first uniaxial rotary cylindrical joint comprising a first cylindrically concave surface in slidable contact with a first cylindrically convex surface, said first cylindrically concave surface and said first cylindrically convex surface having a common first radius of curvature relative to a common first cylinder axis;
   said first cylindrically concave surface operable to rotate about said common first cylinder axis relative to said first cylindrically convex surface to compensate for uniaxial angular misalignment between said heat source and said heat sink.

2. The device of claim 1 wherein:
   said common first cylinder axis is inclined diagonally relative to the z-axis parallel to the shortest distance between said heat source and said heat sink; and
   said first cylindrically concave surface is operable to slide linearly relative to said first cylindrically convex surface in a direction parallel to said common first cylinder axis to provide z-axis expansion of said variable height thermal interface device.

3. The device of claim 2 further comprising a spring clip mechanically spring loading said first cylindrically concave surface and said first cylindrically convex surface, said spring clip operable to apply a shear force across said first uniaxial rotary cylindrical joint, said shear force coupling to provide said z-axis expansion.

4. The device of claim 3 wherein said spring clip is shaped approximating a deformed rectangular frame, comprising:
   a first side and a second side opposite said first side, wherein said first and second sides are bent inward toward one another;
   said first side operable to couple a compressive force substantially parallel to said first cylindrically concave surface; and
   said second side operable to couple an oppositely directed compressive force to said first cylindrically convex surface.

5. The device of claim 1, further comprising:
   a second uniaxial rotary cylindrical joint comprising a second cylindrically concave surface in slidable contact with a second cylindrically convex surface, said second cylindrically concave surface and said second cylindrically convex surface having a common second radius of curvature relative to a common second cylinder axis;
   said second cylindrically concave surface operable to rotate about said common second cylinder axis relative to said second cylindrically convex surface to compensate for uniaxial angular misalignment between said heat source and said heat sink.

6. The device of claim 5 wherein:
   the orientation about z-axis of said common first cylinder axis is different relative to the orientation of said common second cylinder axis about z-axis; and
   said first and said second uniaxial rotary cylindrical joints are operable to rotate cooperatively to compensate for biaxial angular misalignment between said heat source and said heat sink.

7. The device of claim 5 wherein:
   said common first cylinder axis and said common second cylinder axis are each inclined diagonally relative to the z-axis parallel to the shortest distance between said heat source and said heat sink; and
   said first and said second uniaxial rotary cylindrical joints are each operable to slide linearly to provide combined z-axis expansion of said variable height thermal interface device equivalent to the sum of the z-axis expansions of said individual first and second uniaxial rotary cylindrical joints.

8. The device of claim 1 further comprising a wedge interface having a first planar surface in slidable contact with a second planar surface, said slidably contacting planar surfaces inclined diagonally relative to the z-axis parallel to the shortest distance between said heat source and said heat sink, said wedge interface operable to provide z-axis expansion of said variable height thermal interface device.

9. The device of claim 1 further comprising a multi-axis rotary spherical joint operable to compensate for multi-axis angular misalignment between said heat source and said heat sink.

10. The device of claim 1 further comprising a shim operable to provide z-axis expansion of said variable height thermal interface device.

11. The device of claim 1 further comprising a conformal thermal-interface material applied to interface surfaces within said uniaxial rotary cylindrical joint.

12. The device of claim 1 wherein said uniaxial rotary cylindrical joint consists substantially of high thermal conductivity solid materials.

13. The device of claim 12 wherein said solid high thermal conductivity materials are selected from the group consisting of metals, insulators, semiconductors, and composite materials.

14. The device of claim 12 operable to transfer heat from said heat source through said uniaxial rotary cylindrical joint to said heat sink.

15. The device of claim 14 further operable to transfer heat under compressive loading applied between said heat sink and said heat source.

16. The device of claim 15 coupled mechanically and thermally with a heat sink hold-down device, wherein said heat sink hold-down device is operable to apply said compressive loading.

17. The device of claim 1 wherein said heat source comprises an integrated circuit chip.

18. A variable-height thermal-interface device for transferring heat from a heat source to a heat sink, said device comprising:
   a first wedge interface having a first planar surface in slidable contact with a second planar surface, said slidably contacting first and second planar surfaces inclined diagonally relative to the z-axis parallel to the shortest distance between said heat source and said heat sink, said first wedge interface operable to provide z-axis expansion of said variable height thermal interface device; and
   a second wedge interface having a third planar surface in slidable contact with a fourth planar surface, said slidably contacting third and fourth planar surfaces inclined diagonally relative to the z-axis parallel to the shortest distance between said heat source and said heat sink, said second wedge interface operable to provide z-axis expansion of said variable height thermal interface device.

* * * * *

UNITED STATES PATENT AND TRADEMARK OFFICE
CERTIFICATE OF CORRECTION

PATENT NO. : 6,868,899 B1
APPLICATION NO. : 10/649519
DATED : March 22, 2005
INVENTOR(S) : Joseph M. White et al.

It is certified that error appears in the above-identified patent and that said Letters Patent is hereby corrected as shown below:

On the title page, in field (57), under "Abstract", in column 2, line 10, delete "concave" and insert -- convex --, therefor.

In column 1, line 65, delete "fist" and insert -- first --, therefor.

In column 6, line 10, delete "(run)," and insert -- (nm), --, therefor.

In column 6, line 35, delete "(mn)" and insert -- (nm) --, therefor.

Signed and Sealed this

Eleventh Day of August, 2009

David J. Kappos
*Director of the United States Patent and Trademark Office*